US006957423B1

(12) United States Patent
Ma

(10) Patent No.: US 6,957,423 B1
(45) Date of Patent: Oct. 18, 2005

(54) METHOD OF INLINING A VHDL FUNCTION CALL INTO VERILOG

(75) Inventor: Haibing Ma, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 530 days.

(21) Appl. No.: 09/858,764

(22) Filed: May 15, 2001

(51) Int. Cl.[7] ............................. G06F 9/45; G06F 9/44
(52) U.S. Cl. ..................................... 717/137; 717/106
(58) Field of Search ............................... 717/136, 137, 717/146, 106, 107; 716/1

(56) References Cited

U.S. PATENT DOCUMENTS

| | | | | |
|---|---|---|---|---|
| 4,855,936 A | * | 8/1989 | Casey et al. ................. | 345/520 |
| 5,530,866 A | * | 6/1996 | Koblenz et al. ............ | 717/144 |
| 5,651,111 A | * | 7/1997 | McKeeman et al. .......... | 714/38 |
| 5,754,755 A | * | 5/1998 | Smith, Jr. .................... | 714/38 |
| 5,754,878 A | * | 5/1998 | Asghar et al. ................ | 712/35 |
| 5,951,698 A | * | 9/1999 | Chen et al. ................... | 714/38 |
| 6,121,924 A | * | 9/2000 | Meek et al. ........... | 342/357.13 |
| 6,135,647 A | * | 10/2000 | Balakrishnan et al. ........ | 716/18 |
| 6,226,780 B1 | * | 5/2001 | Bahra et al. .................. | 716/18 |
| 6,243,172 B1 | * | 6/2001 | Gauthier et al. ........... | 358/1.18 |
| 6,243,707 B1 | * | 6/2001 | Humpleman et al. ....... | 707/102 |
| 6,345,387 B1 | * | 2/2002 | Morrison .................... | 717/170 |
| 6,466,898 B1 | * | 10/2002 | Chan ......................... | 716/18 |
| 6,550,058 B1 | * | 4/2003 | Wynn ......................... | 717/158 |
| 6,591,403 B1 | * | 7/2003 | Bass et al. .................... | 716/18 |
| 6,601,024 B1 | * | 7/2003 | Chonnad et al. ............... | 716/3 |
| 2001/0014958 A1 | * | 8/2001 | Yamauchi et al. ............ | 714/38 |
| 2001/0034876 A1 | * | 10/2001 | Panchul et al. ............... | 716/18 |

OTHER PUBLICATIONS

"ANSI C to Behavioral VHDL Translator Ada to Behavioral VHDL Translator" by Robert J. Sheraga, Sep. 1996, The RASSP Digest, vol. 3.*

"C++ Primer, Third Edition" by Stanley B. Lippman et al., AT&T Objectwrite, Inc., 1998. Chapter 14, Section 4.*

Alessandro Fasan and Andrea Fedeli, "IP Reuse: A Novel VHDL to Verilog Translation Flow," Dec. 1998, International Workshop on IP Based Synthesis and System Design, Institut National Polytechnique of Grenoble, France, 4 pages.*

Serge Maginot, "Evaluation Criteria of HDLs: VHDL Compared to Verilog, UDL/I & M," 1992, IEEE, Proceedings of the conference on European design automation, pp. 746-751.*

Douglas J. Smith, "VHDL & Verilog Compared & Contrasted—Plus Modeled Example Written in VHDL, Verilog and C," 1996, ACM, Proceedings of the 33rd annual conference on Design automation, pp. 771-776.*

* cited by examiner

*Primary Examiner*—Tuan Dam
*Assistant Examiner*—Eric B. Kiss
(74) *Attorney, Agent, or Firm*—William E. Zitelli; LeRoy D. Maunu

(57) ABSTRACT

A method of inlining a function call of a first high level design language (HDL) into a second HDL is disclosed comprising the steps of: (a) translating the function call of the first HDL into a function body file of the second HDL; (b) translating a signature of the function call of the first HDL into a data file including predetermined data of the function signature; and (c) translating the function call of the first HDL into a sequence of macro definitions based on the corresponding data file followed by a compiler directive to include the corresponding function body file of the second HDL. In one embodiment, the first HDL is a VHDL and the second HDL is a Verilog HDL.

18 Claims, 1 Drawing Sheet

US 6,957,423 B1

METHOD OF INLINING A VHDL FUNCTION CALL INTO VERILOG

FIELD OF THE INVENTION

The present invention is directed to the translation of a design program of one high level design language into another high level design language, and more particularly, to a method of inlining a function call of a first high level design language into a second high level design language.

BACKGROUND OF THE INVENTION

A circuit design for configuring an electronic programmable gate array (PGA), for example, starts with a high level language textual description of the design which is entered into a software development system for the PGA which generally runs on a personal computer (PC) or a work station. After entry, the high level design language is compiled, placed and routed by the software to produce a bit steam for programming the PGA. There are different types of high level design languages for creating circuit design, like VHDL and Verilog HDL, for example, which are two circuit description languages commonly used for modeling digital circuit designs at multiple levels of abstraction. Circuit designs for PGAs are sometimes kept in libraries in the form of the high level design language in which they were created. While in the past, circuit designers have concentrated on only one language, recent trends in PGA development show that dealing with more than one language may be inevitable in many cases when useful library designs are not in the language of choice or when a designer has developed a library of designs in more than one language. Language translators which translate the library design from one language to another prior to compilation generally provide a solution for such interoperability.

However, due to some differences between VHDL and Verilog HDL, for example, not all constructs of one design language have obvious and direct mapping into another design language such that problems may arise in the compilation thereof. Translating VHDL to Verilog HDL is one example. In translating a VHDL program into a Verilog HDL program for a given design result in some VHDL function declarations and calls not being directly mapped to corresponding Verilog function declarations and calls. This is due to a VHDL feature that a parameter, local variable, or the return value of a VHDL function is a vector of which length is in the form of the function parameters so the vector lengths of a parameter, local variable, or the return value of the same function may be different at different function calling points in the program. Since most design languages, like Verilog HDL, for example, do not support such flexibility for function calls, it is nearly impossible to translate every VHDL function call to a corresponding function call in Verilog HDL, for example.

One solution to this translation problem is to inline function calls, or in other words, to translate such a VHDL function call into a sequence of Verilog HDL statements which correspond to the function declaration. A common implementation of such an inlining solution is to create a comprehensive elaborator which establishes a complete function calling tree and propagates appropriate information throughout the calling tree. The present invention solves the aforementioned problem using standard HDL compiler directives without the necessity of such a comprehensive elaborator.

SUMMARY OF THE INVENTION

In accordance with the present invention, a method of inlining a function call of a first high level design language (HDL) into a second HDL comprises the steps of: (a) translating the function call of the first HDL into a function body file of the second HDL; (b) translating a signature of the function call of the first HDL into a data file including predetermined data of the function signature; and (c) translating the function call of the first HDL into a sequence of macro definitions based on the corresponding data file followed by a compiler directive to include the corresponding function body file of the second HDL. In one embodiment, the first HDL is a VHDL and the second HDL is a Verilog HDL.

DETAILED DESCRIPTION OF THE DRAWING

Figure 1:
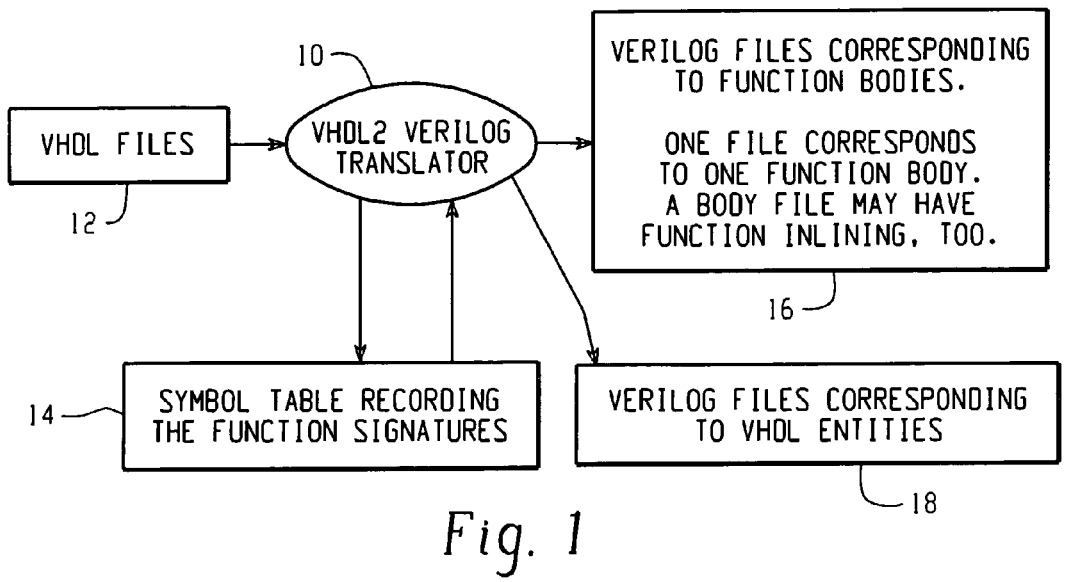
FIG. 1 is an exemplary block flow diagram of an overall translation process suitable for embodying the principles of the present invention.

The present invention comprises a general method of inlining functions when translating designs of one design language to another, like translating a design in a VHDL design language into a Verilog design language, for example. In general, an inline function call is translated into two parts: a mapping part for actual parameters and the return value thereof, followed by a compiler directive, like 'include, for example, which includes a function body file. The function body file includes translated Verilog code for the function body. In the Verilog code for the function body, all formal parameters of the function and some operators of interest are renamed to text macros. All local variables of the function are renamed appropriately to avoid name collisions after inlining. Appropriate block statements may be inserted into the function body file to also avoid name collisions. The parameter mapping part may be a sequence of macro definitions for those macros used in the corresponding body file. The method uses by way of example standard Verilog compiler directives and Verilog scope rules which operate on information gained by the analysis of the same file including the function call of interest and the signature thereof to avoid creating a comprehensive elaborator. This general method will become better understood from the more detailed description thereof along with examples found herein below.

The description will begin with a syntax definition of a VHDL function declaration. A VHDL function declaration can be described in the following EBNF rule:

```
function_declaration ⇐ [ 'pure' | 'impure' ] 'function' (
    identifier | operator ) [ '(' parameter_interface_list ')'
]
'return' type_mark 'is'
        { subprogram_declarative_part }
'begin'
        { sequential_statement }
'end' [ 'function' ] [ identifier | operator_symbol ] ';'
```

In the above rule, a word in the bold font and enclosed in a single quote pair is a literal clause. A word in the italic font is a clause name that appears on the left-hand side according to the EBNF rule. An optional clause of the rule is indicated by enclosing it between the bracket symbols "[" and "]". A list of optional items separated by the symbol "|" can be inside the symbols "[" and "]". Only one item of the item list can be the optional clause. Sometimes an optional clause can be indicated to be repeated as many times as needed. This kind of clause is enclosed inside the symbols "{" and "}".

In the present embodiment, there are three cases when the method may be desirable in translating VHDL programs to Verilog programs:

1. A parameter defined in the parameter_interface_list is a vector but the length of the vector may differ at different calling points, i.e. the length is not defined in the parameter interface definition but is passed by the length attribute of the vector;
2. The return type defined in the type_mark is a vector but the length of the vector may differ at different calling points, i.e. the length is not defined or is derived from the parameters;
3. A local variable that declared in the subprogram_declarative_-part is a vector but the length of the vector may differ at different calling points, i.e. the length is derived from the parameters.

Found below is a typical example of an VHDL function declaration:

```
function sign_ext(inp : std_logic_vector; new_width : INTEGER)
    return std_logic_vector
  is
    constant old_width : integer : inp'length;
    variable vec : std_logic_vector(old_width-1 downto 0);
    variable result : std_logic_vector(new_width-1 downto 0);
  begin
    vec := inp;
    -- sign extend
    if new_width >= old_width then
        result(old_width-1 downto 0) := vec;
        if new width-1 >= old width then
            for i in new_width-1 downto old_width loop
                result(i) := vec(old_width-1);
            end loop;
        end if;
    else
        result(new_width-1 downto 0) := vec(new_width-1
downto 0);
    end if;
    return result;
end;
```

In the above exemplary function declaration, the vector length of the parameter inp is not explicitly defined and is passed by the length attribute of the parameter inp. The vector lengths for local variables vec and result, and the vector length of the return type are derived from the length attribute of the inp parameter and from the new_width parameter.

An exemplary embodiment of the present invention comprises the following steps:

1. Translating a VHDL function of interest into a function body file in Verilog HDL;
2. Translating a signature of the VHDL function into some kind of data file, like a symbol table or a template, for example; and
3. Translating a VHDL function call to a sequence of macro definitions followed by a compiler directive, like 'include, for example, for the corresponding body file.

More specifically, in step (1), every VHDL function is translated into a Verilog file that is called a generated function body file. Though the name of the file is a choice of implementation, the mapping from VHDL function signatures to a Verilog file name should be deterministic for a particular implementation. For example, deterministic mapping guarantees that the file that contains the corresponding Verilog body of a VHDL function may be located without obtaining too much information that is not in the VHDL file being translated. An example of such mapping is that the Verilog program piece from a VHDL function named vhdlFunName can be generated into a file called vhdlFunName.body.v. Such a generated Verilog file only contains Verilog programs generated from the {subprogram_declarative_part} and the {sequential_statement} represented in the EBNF rule.

In addition, every parameter of the function is translated into a Verilog macro name in the generated function body file. If a VHDL parameter is a vector type, the access for the length attribute should be replaced by a Verilog HDL attribute. Though the macro names are choices of implementations, choices of such macro names should avoid name collision as much as possible. Proper prefixes or postfixes for the Verilog macro renaming are recommended. Further, every local variable and constants declared inside the VHDL function should also be added proper prefixes or postfixes to avoid name collision after inlining. Still further, the top level of the generated function body file is a Verilog block statement of which label is a Verilog macro and the actual text of the macro is defined at each function calling point. The purpose of inserting a Verilog block as the top level is to also prevent name collision.

In step (1) of the exemplary method, a return statement of the VHDL function is translated into an assignment operator in Verilog HDL. In the present embodiment, the left-hand side of the assignment is a macro which will be defined at the function calling point. Either one of two kinds of assignment operators may be used, and the assignment operator is also a macro defined at the function calling point. The right-hand side of the assignment operator is an honest translation of the expression in the VHDL return statement.

An exemplary function body file for the above sign_ext VHDL function may be generated as follows (the text between the symbols /* and */ is commentary):

```
/* Conceptually this VHDL function will be
translated into a function with the following signature:
    sign_ext(inp : std_logic_vector; inp_length : INTEGER;
            new_width :INTEGER)
    return std_logic_vector */
/* function sign_ext(inp : std_logic_vector; new_width : INTEGER)
        return std_logic_vector */
/* There are three formal parameters: inp, inp_length, and new_width.
These formal parameters are renamed to 'sign_ext_inp,
'sign_ext_length, and 'sign_ext_new_width. These formal
parameters are defined at the calling point.
*/
/* 'sign_ext_entry_label is defined at the calling point also */
/* Here we start a new block or say scope */
begin : 'sign_ext_entry_label
/* Local variables and constants are also added the
sign_ext_prefix to prevent name collision when an actual
parameter has the same name as that of the formal parameter.
So old_width is renamed to sign_ext_old_width, vec to
sign_ext_vec, result to sign_ext_vec */
    parameter sign_ext_old_width = 'sign_ext_inp_length ;
    reg [sign_ext_old_width - 1:0]       sign_ext_vec;
    reg ['sign_ext_new_width - 1:0]      sign_ext_result;
    sign_ext_vec = 'sign_ext_inp;
```

-continued

```
    if ('sign_ext_new_width >= sign_ext_old_width) begin
        sign_ext_result[sign_ext_old_width - 1:0] =
sign_ext_vec;
        if ('sign ext_new_width - 1 >= sign_ext_old_width)
begin
        begin : sign_ext_xilinx_label_1
/* Integer variable i is renamed to sign_ext_i*/
            integer sign_ext_i;
            for(sign_ext_i = 'sign_ext_new_width -1;
                sign_ext_i >= sign_ext_old_width;
                sign_ext_i = sign_ext_i - 1) begin
                sign_ext_result[sign_ext_i]=
                    sign_ext_vec[sign_ext_old_width - 1];
            end
        end //block : sign_ext_xilinx_label_1
        end
    end else begin // if (new_width >= old_width)
        sign_ext_result['sign_ext_new_width - 1:0] =
            sgn_ext_vec ['sign_ext_new_width - 1:0];
    end // else: !if('new_width >= 'old_width)
/* 'sign_ext_return_to and 'sign_ext_return_assign_op are defined
        at the calling point */
        'sign_ext_return_to 'sign_ext_return_assign_op
sign_ext_result ;
end //block : 'sign_ext_entry_label.
```

More specifically, in step (2), the signature of the function of interest is analyzed for the identification of predetermined data therefrom and the identified data may be recorded properly in a data file which, for example, may be a symbol table that is a kind of data base recording. The data file is accessible by subsequent translations of the VHDL function calls. Examples of predetermined data identified from the signature upon analysis thereof are the name of the function, the number of parameters, the types of parameters, and the positions of parameters, for example.

A template data structure or a template file for future macro definitions at the calling points may be derived from such symbol table. If such a template file is generated, no persistent symbol table may be needed. Each parameter of the VHDL function, the length parameter of a parameter if the parameter is a vector, the top level block label in the Verilog function body file, the assignment operator for the return value, and the variable assigned to with the return value at the calling point may be assigned as place holders of the template file.

An example of a template file for the sign_ext function signature may be derived as follows:
'ifdef sign_ext_return_to
'undef sign_ext_return_to
'endif
'define sign_ext_return_to $return_value
'ifdef sign_ext return_assign_op
'undef sign_ext return_assign_op
'endif
'define sign_ext_return_assign_op $assign_oper
'ifdef sign_ext_entry_label
'undef sign_ext_entry_label
'endif
'define sign_ext_entry_label $entryLabel
/*mapping actual parameter of a function call*/
/* mapping actual parameter inp*/
'ifdef sign_ext_inp
'undef sign_ext_inp
'endif
'define sign_ext_inp $1
/* length is obtained from declaration in the current analyzed
    vhdl file.

Just be aware that orig_width could also be an input parameter in a fuction, in that case the length should be 'orig_width */
'ifdef sign_ext_inp_length
'undef sign_ext_inp_length
'endif
'define sign_ext_inp_length $1.length
/*mapping actual parameter new_width*/
'ifdef sign_ext_new_width
'undef sign_ext_new_width
'endif
'define sign_ext_new_width $2

Then, in step (3) the function call of interest may be translated at its calling point by filling the corresponding templates followed by an 'include compiler directive to include the corresponding function body file. The length information of the actual parameters may be obtained from the declarations of these actual parameters. All instantiation of templates for one generated Verilog file should guarantee no two defined top level block labels are the same.

For example, if we have the following VHDL piece:
variable vec : std_logic_vector(orig_width-1 downto 0);
variable result : std_logic_vector(new_width-1 downto 0);
begin
. . .
result :=sign_ext(vec, new_width);

and the translated Verilog HDL language or code may be as follows:
reg [orig_width-1:0] vec;
reg [new_width-1:0] result;
begin : xilinx_top_0
. . .
'ifdef sign_ext_return_to
'undef sign_ext_return_to
  'endif
'define sign_ext_return_to result
'ifdef sign_ext return_assign_op
  'undef sign_ext_return_assign_op
'endif
'define sign_ext_return_assign_op
'ifdef sign_ext_entry_label
  'undef sign_ext_entry_label
'endif
'define sign_ext_entry_label sign_ext_xilinx_0
/*mapping actual parameter of a function call*/
/* mapping actual parameter inp*/
'ifdef sign_ext_inp
  'undef sign_ext_inp
'endif
'define sign_ext_inp vec
/* length is obtained from declaration in the current analyzed
    vhdl file.

Just be aware that orig_width could also be an input parameter in a fuction, in that case the length should be 'orig_width */
'ifdef sign_ext_inp_length
    undef sign_ext_inp_length
'endif
'define sign_ext_inp_length (orig_width−1−0+1)
/*mapping actual parameter new_width*/
'ifdef sign_ext_new_width
    undef sign_ext_new_width 'endif
'define sign_ext_new_width new_width
'include "sign_ext.body.v"

FIG. 1 is an exemplary block flow diagram of an overall translation process suitable for embodying the present invention in accordance with the foregoing explanation. Note that the VHDL function call is translated after the translating of the corresponding function body file because the translator has the signature of the function when translating function calls of the function. In FIG. 1, an oval entity 10 represents a Vhdl-to-Verilog translator of interest. Rectangular entities of FIG. 1 provide inputs to the translator 10 and/or receive outputs from the translator 10. Arrowed lines in FIG. 1 indicate the direction of information flow. The Vhdl-to-Verilog translator 10 may be invoked many times.

Referring to FIG. 1, the Vhdl-to-Verilog translator 10 is operative to read in a list of Vhdl files from block 12. The translator 10 is operative to analyze the functions of the read Vhdl files, record signatures of the Vhdl functions that have been analyzed in a symbol table, for example, in block 14, and generate Verilog files for the function bodies thereof in block 16. Accordingly, when a Vhdl function call is encountered, the translator 10 searches the recorded function signatures in block 14 to identify a signature designated to the function call, uses the identified signature as a guide, and translates the function call into a list of macro definitions followed by a compiler directive, like 'include, for example, to include the corresponding function body file from block 16. The inserted macro definitions and the 'include directive are part of generated Verilog files corresponding to Vhdl entity/architecture declarations which are stored in block 18. In the process of FIG. 1, it is preferred that the signature of a function be recorded. prior to the time a Vhdl function call is to be translated.

Figure 2:
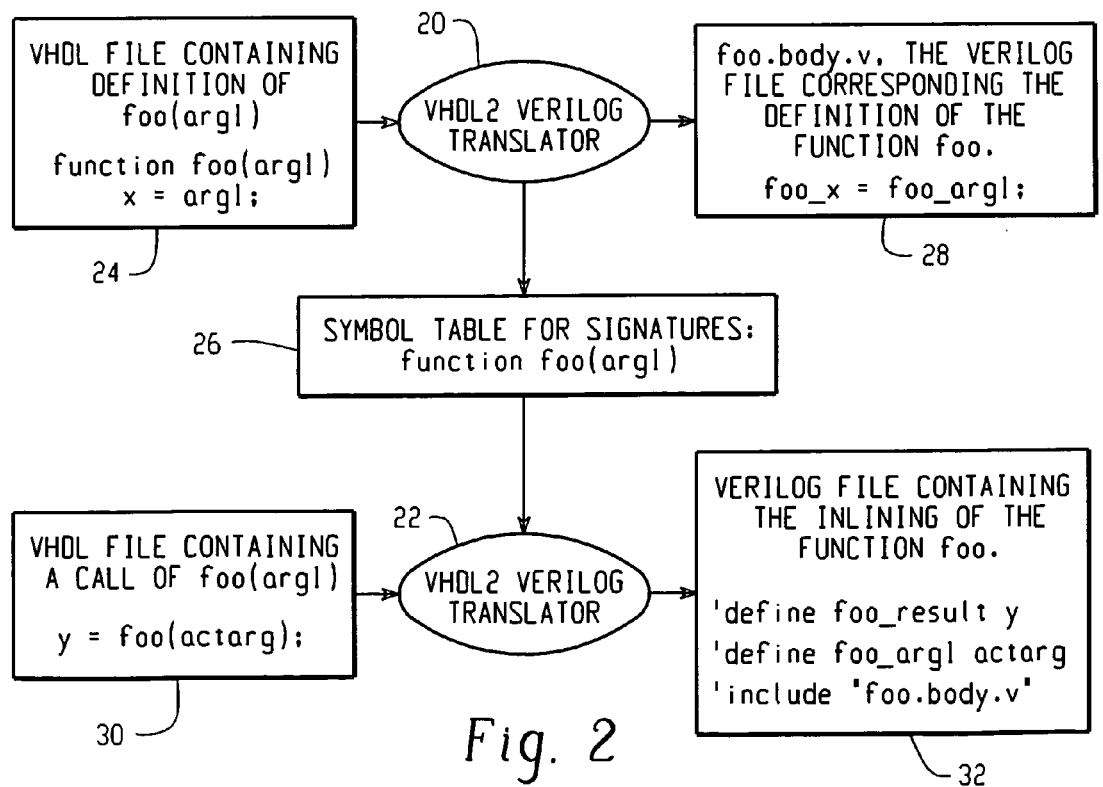
FIG. 2 is an exemplary block flow diagram illustrating a translation process for a function foo.

FIG. 2 is another block flow diagram which illustrates a translation process for a function foo which has one formal argument named arg1, as an example. Inside the function declaration, x is a local variable of the function, and actarg is the actual argument at the calling point of the function. After translation, x is renamed to foo_x to prevent name conflict, arg1 is renamed to macro 'foo_arg1, and actarg is the actual argument which is assigned to the macro 'foo_arg1. Referring to FIG. 2, two oval entities 20 and 22 represent just one program for Vhdl-to-Verilog translation, but in different stages of translation. Translation stage 20 reads the Vdhl file containing the function foo(arg1) from block 24. The translation stage 20 is operative to analyze the function foo(arg1) of the read Vhdl file, record its signature in a symbol table, for example, in block 26, and translate the body of the function foo and store the translation in a Verilog file foo.body.v in block 28. Accordingly, when the Vhdl function call of foo(arg1) is encountered via block 30, the translation stage 22 searches the recorded function signatures in block 26 to identify the signature designated to the function foo(arg1), uses the identified signature as a guide, and translates the function call into a list of macro definitions followed by a compiler directive, like 'include, for example, to include the corresponding function body file foo.body.v from block 28. The inserted macro definitions and the 'include directive are part of a generated Verilog file containing the inlining of the function foo which is stored in block 32.

While the present invention has been described herein above in connection with one or more embodiments, it is understood that this was done merely by way of example and that there is no intention of the described embodiments limiting the present invention in any way, shape or form. Rather, the present invention should be construed in breadth and broad scope in accordance with the recitation of the claims appended hereto.

What is claimed is:

1. Method of inlining a function call of a first high level design language (HDL) into a second HDL, said method comprising the steps of:
   (a) translating a function of the first HDL into a function body file of the second HDL;
   (b) translating a signature of the function of the first HDL into a data file including predetermined data of the function signature; and
   (c) translating the function call of the first HDL into a sequence of macro definitions based on the corresponding data file followed by a compiler directive to include the corresponding function body file of the second HDL.

2. The method of claim 1 wherein step (a) includes a deterministic mapping from said signature of the function of the first HDL to the function body file of the second HDL.

3. The method of claim 2 wherein step (a) includes the steps of:
   translating each parameter of the function of the first HDL into a macro name in the function body file of the second HDL;
   adding proper prefixes or post-fixes to the local variables and constants declared in the function of the first HDL for the function body file of the second HDL;
   labeling the top level of the function body file as a macro block statement of the second HDL;
   defining the actual text of the macro block statement at each calling point of the function of the first HDL; and
   translating a return statement of the function of the first HDL into an assignment operation of the second HDL.

4. The method of claim 3 including defining the assignment operation at the function calling point as a macro, wherein the left-hand side of the assignment operation is a macro and the right-hand side of the assignment operation is a translation of the expression in the return statement of the function of the first HDL.

5. The method of claim 3 wherein the step of translating a parameter includes the step of translating a vector type parameter by replacing the access length attribute thereof with an access length attribute of the second HDL.

6. The method of claim 1 wherein the step (b) includes the steps of:
   analyzing the signature of the function of the first HDL to identify the predetermined data thereof;
   recording the identified predetermined data into the data file; and
   rendering the data file accessible to translations of the function of the first HDL.

7. The method of claim 6 wherein the predetermined data is recorded in a symbol table.

8. The method of claim 6 wherein the predetermined data identified from the function signature includes: name of the function, number of parameters, types of parameters, and positions of parameters.

9. The method of claim 8 including the step of deriving a template file of templates from the data file for macro definitions at the calling points of the function.

10. The method of claim 9 assigning each parameter of the function, a length attribute of each vector parameter, a top level block label in the function body file, an assignment operator for a return value and a variable assigned thereto at the function calling point as a place holder of the template file.

11. The method of claim 9 wherein the step (c) includes the step of translating the function call at the calling point by filling the corresponding templates of the template file with corresponding data identified from the function.

12. The method of claim 11 including the step of obtaining the length of the vector parameters of the function call at the calling point from the declarations thereof within the function.

13. The method of claim 11 including the step of guaranteeing that an instantiation of the templates of the template file for the function include no two top level blocks with the same label.

14. Method of inlining a function call of a VHDL design language into a Verilog HDL design language, said method comprising the steps of:
(a) translating the VHDL function into a function body file of Verilog HDL;
(b) translating a signature of the VHDL function into a data file including predetermined data of the function signature; and
(c) translating the VHDL function call into a sequence of macro definitions based on the corresponding data file followed by a compiler directive to include the corresponding Verilog HDL function body file.

15. The method of claim 14 wherein step (a) includes the steps of:
translating each parameter of the VHDL function into a macro name in the Verilog HDL function body file;
adding proper prefixes or post-fixes to the local variables and constants declared in the VHDL function for the Verilog HDL function body file;
labeling the top level of the function body file as a macro block statement of Verilog HDL;
defining the actual text of the macro block statement at each calling point of the VHDL function; and
translating a return statement of the VHDL function into a Verilog HDL assignment operator.

16. The method of claim 14 wherein the step (b) includes the steps of:
analyzing the signature of the VHDL function to identify the predetermined data thereof;
recording the identified predetermined data into the data file; and
rendering the data file accessible to translations of the VHDL function.

17. The method of claim 16 including the step of deriving a template file of templates from the data file for macro definitions at the calling points of the function.

18. The method of claim 17 wherein the step (c) includes the step of translating the VHDL function call at the calling point by filling the corresponding templates of the template file with corresponding data identified from the VHDL function.

* * * * *